United States Patent [19]

Morgan

[11] Patent Number: 5,284,888
[45] Date of Patent: Feb. 8, 1994

[54] CORROSION INHIBITING EMI/RFI SHIELDING COMPOSITION AND METHOD OF ITS USE

[75] Inventor: Noredin H. Morgan, Billerica, Mass.

[73] Assignee: Chomerics, Inc., Woburn, Mass.

[21] Appl. No.: 783,281

[22] Filed: Oct. 28, 1991

Related U.S. Application Data

[63] Continuation-in-part of Ser. No. 475,983, Dec. 28, 1989, Pat. No. 5,061,566.

[51] Int. Cl.$^5$ .......................... C08K 3/08; C08K 3/10; C08K 5/34
[52] U.S. Cl. ........................................ 524/93; 524/94; 524/435; 524/718; 524/720; 524/779; 524/780; 524/781; 524/785; 528/60; 528/61; 528/63; 528/76; 528/77; 528/83
[58] Field of Search ................... 524/93, 94, 435, 718, 524/720, 779, 780, 781, 785; 528/60, 61, 63, 76, 77, 83

[56] References Cited

U.S. PATENT DOCUMENTS

| | | | |
|---|---|---|---|
| 3,293,203 | 12/1966 | Paulus et al. | 260/37 |
| 3,344,064 | 9/1967 | Brady et al. | 252/12 |
| 3,422,165 | 1/1969 | Brotherton et al. | 260/859 |
| 3,948,811 | 4/1976 | Clary et al. | 252/512 |
| 4,305,847 | 12/1981 | Stoetzer et al. | 252/512 |
| 4,610,808 | 9/1986 | Kleiner | 252/512 |
| 4,629,756 | 12/1986 | Kerbow | 524/440 |
| 4,657,785 | 4/1987 | Kelly et al. | 427/255.6 |
| 4,705,647 | 11/1987 | Yamaguchi et al. | 252/512 |
| 4,781,980 | 11/1988 | Yoshitake et al. | 428/403 |
| 4,863,986 | 9/1989 | Re et al. | 524/197 |
| 4,873,139 | 10/1989 | Kinosky | 428/341 |
| 4,921,623 | 5/1990 | Yamaguchi et al. | 252/512 |
| 4,931,479 | 6/1990 | Morgan | 521/76 |
| 4,950,423 | 8/1990 | Sullivan | 524/401 |
| 5,061,566 | 10/1991 | Morgan | 428/423.1 |

FOREIGN PATENT DOCUMENTS 61-87766 5/1986 Japan .

OTHER PUBLICATIONS

"Technical Bulletin 3401" PMC Specialties Group.
"Technical Data Bulletin: Polyamine$^R$ 1000" Polaroid.
"Structure-Activity Relationships of Triazole Copper-Corrosion Inhibitors: Rational Development of Enhanced Activity Inhibitors", Orin Hollander, Paper No. 455, Corrosion '89, Apr. 17-21, 1989.
"Benzotriazole and Related Compounds as Corrosion Inhibitors for Copper", J. B. Cotton and I. R. Scholes, British Corrosion Journal, 1967, vol. 2, Jan.
"Aromatic Triazoles Inhibit Corrosion of Copper and Copper Alloys", C. J. Korpics, Materials Performance, vol. 13, No. 2, pp. 36-38, Feb., 1974.

*Primary Examiner*—Paul J. Thibodeau
*Assistant Examiner*—D. S. Nakarani
*Attorney, Agent, or Firm*—Nicholas P. Triano, III; John Dana Hubbard; William L. Baker

[57] ABSTRACT

A corrosion inhibiting, EMI/RFI shielding composition is provided comprising a polyurethane resin which comprises a hydroxy or amine functional first polymer and an isocyanate, or isocyanurate terminated second polymer, a stabilized conductive filler, and an azole. In one embodiment of the invention a composition is provided comprising a polyurethane which comprises a fluoroolefin vinyl ether and an isocyanurate, a stabilized copper powder, and a triazole selected from the group consisting of alkyl substituted aromatic triazoles and other azoles. The invention further provides a method of composition a substrate with a composition of the invention in order to provide EMI/RFI shielding and prevent corrosion, and a substrate thus coated.

25 Claims, 2 Drawing Sheets

CORROSION INHIBITING EMI/RFI SHIELDING COMPOSITION AND METHOD OF ITS USE

BACKGROUND OF THE INVENTION

This application is a continuation in part of U.S. application Ser. No.: 07/457,983, filed on Dec. 28, 1989 now U.S. Pat. No. 5,061,566.

The present invention relates to a conductive composition which provides shielding against electromagnetic interference (EMI) and minimizes corrosion when applied to conductive substrates, remains electrically conductive and is used as a sealant, caulk or "form in place" gasket.

When dissimilar metal and/or conductive composite substrates are joined together in the presence of an electrolyte, a galvanic potential is established at the interface between the substrates. If this assembly is exposed to the environment, particularly under severe conditions such as salt fog or salt fog containing a high concentration of $SO_2$, corrosion of the least noble of the substrates will occur, causing failure of the assembly. Mechanisms other than the establishment of galvanic potentials, e.g. crevice corrosion, may also cause corrosion and eventual failure of the part. In these cases one or all of the exposed materials in the assembly may corrode.

Thus, it has long been an object, especially among manufacturers of aircraft, ships, telecommunication equipment and other such equipment which is to be exposed to the environment, to prevent corrosion at these interfaces.

Further, it is often necessary to provide electromagnetic energy control and electrical control of surface wave conductivity to the equipment described above, as aircraft, ships, etc., frequently utilize electronic systems which either radiate or are susceptible to electromagnetic or radio frequency interference (EMI/RFI), lightning strikes, etc.

Various methods have been attempted to achieve minimal corrosion with optimum shielding. Conventional shielding gaskets have been used in these applications to provide EMI/RFI shielding. These gaskets generally provide satisfactory shielding, but can cause significant corrosion of the structural metal (e.g. aluminum). In fact, when the metal filler or mesh in the shielding gasket is different from either of the adjacent substrates, a galvanic potential is established across all three elements, often causing the gasket itself, and eventually the entire assembly, to corrode. Further, the interface between such preformed gaskets, and the substrate to which they are applied typically contains voids and airspace which detracts from shielding effectiveness and may promote corrosion. Thus, it would be advantageous to provide a composition which could be used to form a gasket directly on the substrate (referred to hereinafter as a "form-in-place gasket").

Coatings comprising nickel fillers in elastomer have been applied to the substrates in an attempt to improve shielding and reduce corrosion. This approach is capable of providing acceptable shielding effectiveness of the assembly, but under conditions in which the coating remains conductive it can cause significant corrosion.

Some success in preventing corrosion has been obtained by sealing the interface with nickel and nickel coated graphite filled polythioether or polysulfide sealants containing chromate corrosion inhibitors. However, it is difficult to handle and to dilute these systems enough to use them as sprayable coatings, which are generally preferred for their ease of application. Further, they do not exhibit good thermal stability and become brittle over time.

Thus it is desired to provide a composition suitable for use as a sealant, form-in-place gasket caulk, or coating which will maintain good EMI/RFI shielding and cause minimal corrosion of conductive substrates, even in severe environments. It is further desired to provide such a composition without the use of hazardous chromates.

SUMMARY OF THE INVENTION

The present invention is directed to EMI/RFI shielding composition which cause minimal corrosivity. More particularly, the invention is directed to a low corrosion conductive composition comprising a polyurethane resin which comprises a first polymer selected from the group consisting of isocyanates, isocyanurates, biurets and isocyanate terminated prepolymers, and a second polymer selected from the group consisting of polymers having an amine functionality, polymers having a hydroxyl functionality, polymers having both amine and hydroxyl functionalities, and mixtures thereof; a stabilized conductive filler; and an azole. Optionally, the composition may further comprise a reactive diluent and/or a thixotropy increasing agent.

In one embodiment of the invention the corrosion inhibiting composition comprises a polyurethane resin comprising a first polymer selected from the group consisting of isocyanurates and biurets and a second polymer selected from the group consisting of polyether polyels, polythiols and polyamines; a stabilized copper powder; and a triazole selected from the group consisting of alkyl substituted aromatic triazoles and other aromatic triazoles. In a preferred embodiment the coating comprises from about 10 to 50 weight percent polyurethane, from about 30 to 80 weight percent stabilized conductive filler, and from about 0.1 to 3 weight percent aromatic triazole, based on the total solids in the composition. It is also preferred that the weight ratio of the first to second polymer be from about 1:2 to 1:6, that the second polymer be fluorinated, and that the stabilized conductive filler be a stabilized copper powder.

In its method aspects, the present invention is directed to a method of maintaining good EMI/RFI shielding while providing a low corrosivity interface between a plurality of conductive substrates to prevent corrosion when these substrates are exposed to harsh environments, e.g. in naval and aerospace applications. This method comprises the steps of (a) providing a corrosion inhibiting conductive composition comprising a polyurethane resin which comprises a first polymer selected from the group consisting of isocyanates and isocyanate terminated prepolymers, and a second polymer selected from the group consisting of polymers having an amine functionality and polymers having a hydroxyl functionality; a stabilized conductive filler; and an triazole; and (b) applying the corrosion inhibiting sealant composition such that the composition forms a conductive interface between two conductive substrates. The method may further comprise the additional step of curing the sealant. The sealant may be cured for at least 15 minutes, and preferably at least 30 minutes at 250° F., or at least 5 days, and preferably 7 days at ambient temperature.

The present invention further provides a form-in-place gasket formed from a composition according to the invention. The composition is applied to a conductive substrate in a desired configuration such that a shielding gasket is formed from the composition, directly on the substrate. The thus assembled part may be exposed to severe environments such as salt fog with minimal corrosion of the part.

IN THE DRAWINGS

DETAILED DESCRIPTION OF THE INVENTION

Figure 1:
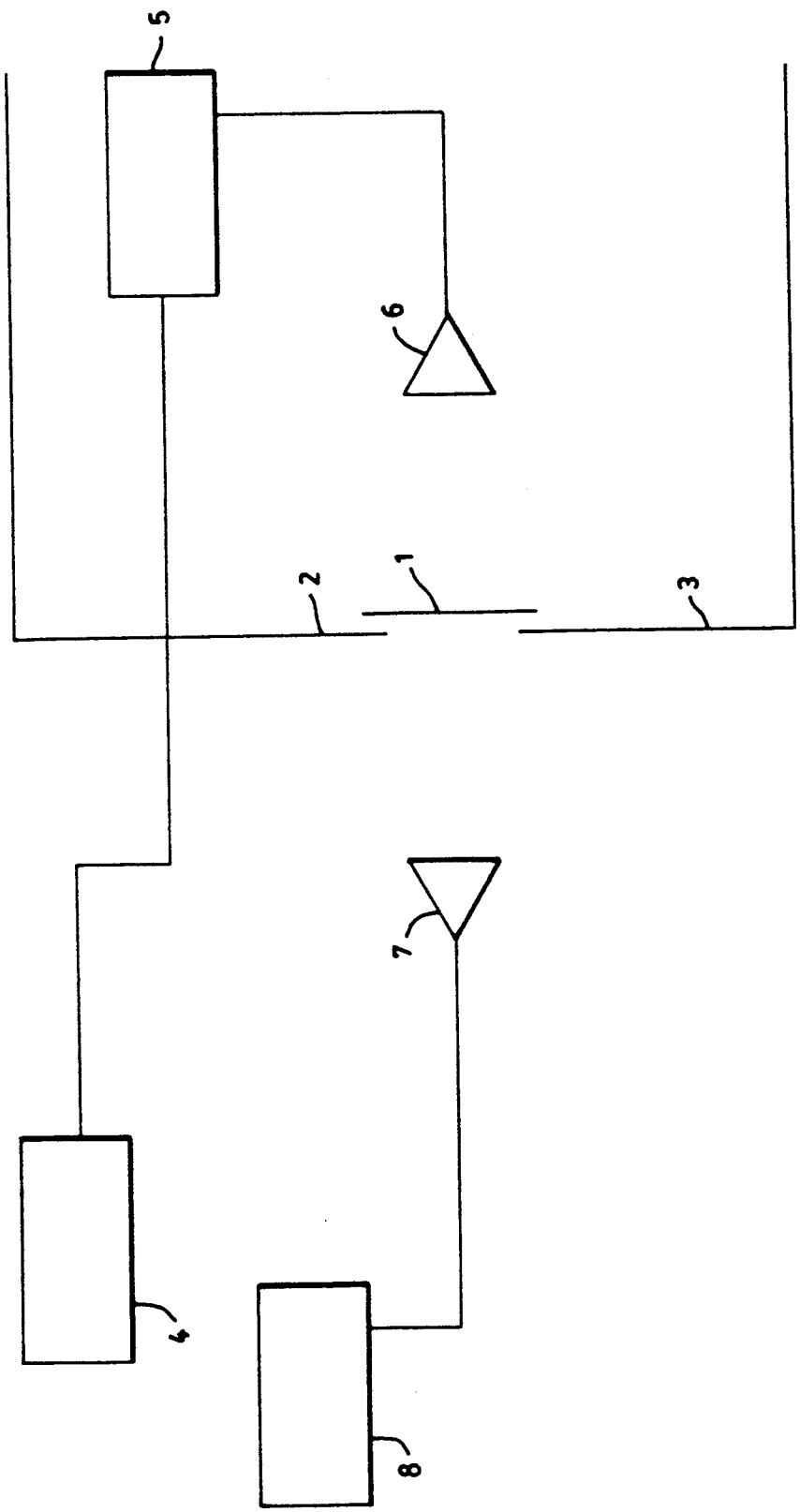
FIG. 1 shows a diagram of the preferred testing set up.

The present invention relates to a corrosion inhibiting composition comprising a polyurethane resin, a stabilized conductive filler, and an aromatic triazole. It has been found that this combination unexpectedly inhibits or minimizes the corrosion of a variety of conductive substrates and maintain high shielding effectiveness, even under severe conditions such as long term exposure to salt fog, salt fog containing a high concentration of $SO_2$, etc.

The composition of the invention is generally provided as a two component system, with the hydroxy or amine functional second polymer (part A), and the isocyanate or biuret terminated first polymer (part B) being stored separately until the time of use. Generally, the stabilized conductive filler, aromatic triazole, and any other optional ingredients are incorporated in part A. Part A and part B, when stored separately, are generally shelf stable for at least 6 months at ambient temperature. When the two components are mixed, the mixture will begin to increase in viscosity as it cross-links until it eventually gels. The time during which the mixture is of a workable viscosity, i.e. the pot life of the composition, will vary depending upon the hydroxyl number of the second polymer, the batch size, the solids level of the composition, and any optional accelerators, diluents or inhibitors present in the composition. The pot life will generally be from about 15 minutes to about 2 hours. After the composition is applied to a substrate, chain extension and/or cross-linking will continue, but at a slower rate since the composition is now present in a relatively thin film or bead and the exothermic cure reaction is unable to generate as much heat as when the mixture was present in a large mass. Thus the cure time of an unaccelerated composition in a thin film will generally be at least 5 days, and usually 7 days at ambient temperature. If a faster cure is desired the composition may be heat cured. In this case, it is preferred that the composition be cured for at least 15 minutes, and preferably 30 minutes at about 250° F. It is particularly preferred that the composition be allowed to dry for at ambient temperature before heat curing. Preferably, the drying time should be at least one hour, more preferably several hours, most preferably about 20 hours. The rate of cure may also be accelerated by the addition of optional accelerators such as metallic catalysts, e.g. dibutyltin dilaurate, although the addition of an accelerator will also tend to shorten the pot life of the mixture. The addition of an accelerator is preferred in applications in which it would be impractical to heat cure, e.g. where a sealant of the invention is applied to a very large part such as a shielded enclosure.

Many combinations of hydroxy or amine functional and isocyanurate or isocyanate-functional polymers may be successfully used in the present invention to form the reacted polyurethane. It is generally preferred that the polyurethane be hydrophobic; it is particularly preferred that the hydroxy or amine functional second polymer be fluorinated. It is also preferred that the second polymer be selected from the group consisting of polyether polyols and polyether amines. The preferred molecular weight and hydroxyl number of the second polymer will vary based on the requirements of the given application; the higher the hydroxyl number, the better the chemical resistance of the composition, but the shorter its pot life. For applications in which the composition is to be used as a sealant or form-in-place gasket, it is generally preferred that the hydroxyl number be very low, i.e. less than 1, to obtain maximum pot life. For most applications, a molecular weight of from 2000 to 150,000 and hydroxyl number of from 25 to 100 are preferred. It is also generally preferred that the hydroxyl or amine functionality be greater than 1. Particularly preferred polymers are fluoroolefin vinyl ethers, such as those commercially available from I.C.I. Americas, Inc. under the tradename LUMIFLON ®. These polymers generally have a molecular weight of from about 4000 to 150,000 and a fluorine content of from 25% to 30%, and an acid number of about 0 to 5. A particularly preferred polyether amine is polytetramethyleneoxide-di-p-aminobenzoate, commercially available from Polaroid Corp. under the tradename POLYAMINE ® 1000. Polythiols which may be used in the invention include polyether/thioether polyols.

Most isocyanate resins, isocyanate terminated prepolymers, isocyanurates and biorets may be used in the invention. Biurets such as DESMODOR N-75 and isocyanurates are generally preferred. Particularly preferred is an isocyanurate, which is commercially available from Mobay Chemical under the tradename DESMODUR 3200. This polymer is preferred because it increases the cross-link density and thus the chemical resistance and thermal stability of the composition. Generally, isocyanurates are preferred for their chemical resistance, while castor oil based prepolymers are preferred for their corrosion resistance.

A preferred prepolymer having a low level of free isocyanate and which provides good elongation sticity is known as BAYTEC ME 040 (4% free isocyanate) and BAYTEC ME 050 (5% free isocyanate). These also have a lower chemical resistance and a shorter pot life.

The term "stabilized conductive filler" as used herein refers to any electrically conductive filler which has been treated such that the surfaces of the filler particles are protected from oxidation and the filler remains electrically conductive after such treatment. These stabilized fillers, when used in the coating compositions of the invention, have been found to greatly increase the resistance of the coated substrates to corrosion, especially during long term exposure to salt fog or heat, while maintaining sufficient electrical conductivity to provide EMI/RFI shielding. Such stabilizer fillers may be obtained by purchasing them in prestabilized form manufacturer of stabilized fillers, or by purchasing unstabilized conductive fillers and treating them to prevent surface oxidation of the particles. A preferred prestabilized filler for use in the invention is a stabilized copper powder, which is commercially available in prestabilized form from Fujikura Kasei of Japan under the tradename Fujikura ® CP-10. This prestabilized filler is a silver plated copper powder produced by a substitution plating process. This process is described in detail in Japanese Patent No. 53/134759, and comprises coating copper powder with silver metal using a silver complex salt solution comprising from 3 to 30 weight percent silver nitrate, from 15 to 70 weight percent ammonium bicarbonate, and from 23 to 75 weight percent trisodium ethylenediaminetetraacetic acid. The ratio of silver to copper in the final product is generally from 1:99 to 50:50, and preferably from 5:95 to 30:70. Other prestabilized fillers may also be used in the invention. If it is desired by the user to stabilize the filler this may be accomplished by coating the surface of the filler particles with a material which will inhibit oxidation of the particle, generally a noble metal such as gold or silver with or without a fatty acid. The filler may be coated by mixing or milling the filler with a silver salt and/or a fatty acid, preferably for a period of time adequate to coat substantially all of the filler particles. A method of treating fillers with fatty acids is disclosed in U.S. Pat. No. 4,781,980, the disclosure of which is incorporated herein by reference. Fillers which may be stabilized include, but are not limited to copper, nickel, silver plated metals, nickel-graphite fibers and combinations thereof.

Aromatic triazoles are known in the art as corrosion inhibitors, and are believed to directly bond to metal surfaces to produce inhibiting complexes. However, when used in conventional conductive coating systems they do not provide adequate corrosion protection in long term salt fog exposure. For reasons unknown to the inventor, in the composition of the invention, in combination with a polyurethane and a stabilized metal filler, the aromatic triazole provides excellent corrosion resistance during prolonged salt fog exposures of greater than 1000 hours on Al 2000 or 3000 series alloys. In the composition of the invention, any azole may be used, preferably anaroma triazole, an imidazole, or a thiazole, and most preferably an alkyl substituted aromatic triazole, e.g. tolytriazole. These chemicals are readily available commercially. A particularly preferred triazole is a proprietary material available from PMC Specialties Group under the tradename CO-BRATEC® 205. Generally triazoles are acidic, and thus at higher levels the triazole may alter the cure characteristics of the composition, slightly reducing the chemical resistance of the cured coating. For optimal cure characteristics, in applications where high chemical resistance is required, a neutral or alkaline azole, such as 2,5-(aminopentyl)-benzimidazole (commercially available from Mobay Chemical, under the tradename Preventol Trial Products C.T-3) may be used instead of the triazole component of the composition.

Additionally, the composition of the invention may further optionally comprise a chromate salt. This additional additive is preferred in applications where the composition is to be applied to a metal and exposed to mechanical abuse which may cause scratching of the composition. It has been found that the addition of chromates to the composition enables the cured composition to "self-heal" when it is scratched, thereby improving the integrity of the composition and the protection of the underlying metal surface. This property is generally not required when the coating is to be used on a non-meta)- (e.g. composite) substrate. A preferred chromate salt is of zinc such as zinc yellow, and it is generally preferred that the chromate be present in the composition at a level of from about 0.01 ho about 15 weight percent based on the total solids in the composition. It is generally convenient to add the chromate to the composition by first milling it with a portion of the second polymer and then adding it to part A of the composition.

Optionally, the composition may further comprise such conventional additives as surfactants, accelerators, inhibitors, diluents and active solvents, in amounts which do not deleteriously effect the properties of the composition. In the case of solvents, different solvents may be used depending on the desired viscosity of the composition, e.g. if a higher solids composition is desired for use as a sealant or caulk, it may be advantageous to use a low vapor pressure solvent such as a dimethyl ester mixture, e.g. a mixture of dimethyl succinate, dimethyl glutarate and dimethyl adipate to extend the pot life of the composition. A particularly preferred dimethyl ester mixture comprises about 25% dimethyl succinate, about 55% dimethyl glutarate, and about 20% dimethyl adipate. The amount of solvent present in the composition will depend on the particular solvent used, and the desired viscosity of the composition. If a low v.o.c. (volatile organic compound) composition is desired, the ratio of solids to solvent is generally from about 80:20 to 70:30. Preferably, a ratio of 65:35 is preferred. If viscosity is too high, one may dilute the composition further until a desired amount of solids is obtained. Likewise, for use as a sealant or caulk, the solids content can be increased to a ratio of 95:5.

In a preferred embodiment of the invention the polyurethane resin is present in an amount of from about 10 to 50 weight percent of the composition, and the first and second polymers are present in a weight ratio of from about 1:2 to 1:6; the stabilized conductive filler is present in an amount of from about 30 to 80 weight percent of the composition; and the azole is present in an amount of from about 0.1 to 3 weight percent of the composition, based on the total solids in the composition. Particularly preferred levels are from 10 to 25 weight percent of the polyurethane, from 40 to 70 weight percent of the filler, and from 0.5 to 1.75 percent of the triazole. A weight ratio of 1:3.2 of the first to second polymer is particularly preferred. Unless otherwise specified, all weight percents given herein are based on the total weight of solids in the composition.

The present invention is further directed to a method of inhibiting corrosion of substrates while maintaining EMI/RFI shielding comprising the steps of (a) providing a corrosion inhibiting conductive composition according to the invention and (b) applying the corrosion inhibiting composition to a substrate, or at the interface between a plurality of substrates. This method may further comprise the step of (c) curing the composition. The composition may be cured as described hereinabove, either at room temperature or by heating the substrate. It is preferred that prior to heat curing the composition be allowed to dry for approximately 30 minutes at ambient temperature. The composition may be applied to the substrate, if it is a coating, by doctor blade, brushing, spraying, and other conventional coating techniques. Spraying is generally preferred for convenience. If the composition is a sealant or caulk, it may be applied to the interface between two or more substrates by conventional methods used with such materials, e.g. extrusion.

The composition of the invention may be used on any solid substrate, e.g. metals such as aluminum or steel, and composites metal and/or, glass and/or carbon and-/or plastic and/or other polymers.

The invention further provides a form-in-place gasket which is formed from a composition of the invention. The composition is applied to a conductive substrate in a desired configuration such that a shielding gasket is formed from the composition, directly on the substrate. The thus assembled part may be exposed to severe environments such as salt fog with minimal corrosion of the part and minimal degradation in shielding effectiveness.

When permanently applying the material to a substrate, such as in a form in place gasket, it is preferred to treat the substrate with a primer such as CHEMLOK 459 available from Lord Corporation. The use of the primer provides better adhesion of the material to the substrate.

The following examples are illustrative of preferred embodiments of the invention and not of limiting effect. Other variations and modifications of the invention may be practiced by those skilled in the art without departing from the spirit and scope of the invention.

EXAMPLE 1

A corrosion inhibiting conductive sealant of the invention was prepared using the following formulation,

| Components | Parts by Weight |
| --- | --- |
| Tin catalyst | .32 |
| Surfactant | 1.8 |
| Polyester Resin | 28.6 |
| Tolytriazole | 23.86 |
| Fluoropolymer | 257.34 |
| Stabilized Copper Powder | 596.58 |
| HMD Polyisocyanurate | 91.50 |

The components were formed into two parts Part A containing all of the ingredients except for the polyisocyanurate component which formed Part B.

The two parts, A and B were then mixed and applied to an aluminum surface (A135,3000 alloy series) in a layer about 2 to 3 mils thick. One sample was cured at a temperature of 140° F. for two hours. A second sample was cured at a temperature of 250° F. for 30 minutes.

The composition has excellent initial properties and retains these properties for up to 1000 hours of salt fog exposure. More importantly a conductive interface was maintained during the salt fog exposure with no visible corrosion being observed under the sealant. These properties are set out in Table 1 below:

TABLE 1

Physical Properties when cured ¼ hour with 250° F.

Adhesion = 5B (ASTM-D-3359)
Pencil Hardness = 6H
Initial Resistivity (Ohm/Square) = 0.05
Gardener Impact
Direct (in/lbs) = 42
Reverse = 40
Pot Life (65% solids) = 2 hours Chemical Resistance when cured at 250° F. for ½ hour

| Chemical | Exposure Time/(Resistance in Ohms/Square) | | | |
| --- | --- | --- | --- | --- |
| | 0 hours | 2 hours | 48 hours | 72 hours |
| SkydrolLD4 | .05 | 2 | — | — |
| MilH5606 | .06 | .06 | .06 | .06 |
| Hydraulic Fluid JP4 | .06 | .06 | .06 | .06 |
| Low Density Aviation Fuel | .02 | 1 | — | — |

Salt Fog Exposure (ASTM-B-117)

Resistivity (Ohms/square)

TABLE 1-continued

| Example | Initial | 250 Hrs | 500 Hrs | 1000 Hrs |
| --- | --- | --- | --- | --- |
| 1 (cured at 2 hours/ 140° F.) | .035 | .070 | .15 | 1.5 |
| 1A (cured at 30 minutes/ 250° F.) | .020 | .020 | .040 | .20 |

Shielding Properties

The shielding effectiveness was measured using the test panel as shown in FIG. 1. The test panel 1, was bolted to a wall 2 of a shielded enclosure 3 and the electric field attenuation was measured over the frequency range of 40 MHz to 10 GHz by supplying a signal from a signal generator 4 via a power amplifier 5 to a transmitting antenna 6. A receiving antenna 7 on the opposite side of the wall 2 picks up any signal and conveys it to a spectrum analyzer 8 for processing. The test procedure satisfied the requirements of MIL-STD-285. Shielding effectiveness was tested at frequencies from 1 GHz to 10 GHz both before and after salt fog exposure. Shielding effectiveness averaged better than 40 decibels over the frequency range before salt fog exposure. Shielding effectiveness was not significantly effected by salt fog exposure.

EXAMPLE 2

A corrosion resistant form in place gasket according to the present invention was prepared from the following components:

| Components | Amount (parts by Weight) |
| --- | --- |
| Fluoropolyol | 131.3 |
| Polyester polyol | 59.5 |
| Aromatic Azole | 13.9 |
| Acetate Plasticizer | 42.4 |
| Treated Fumed Silica Filler | 5 |
| Stabilized Conductive Copper Powder | 682.3 |
| Polyisocyanate (Biuret) | 65.6 |

All components except for the polyisocyanate were mixed together to form Part A. The polyisocyanate formed Part B. After mixing Parts A and B together, the composition was applied to a surface of an aluminum panel as a form in place gasket, approximately 5 inches wide by 0.006 inches high by X inches long. The composition was then allowed to cure in place.

TABLE 2

Physical Properties

Adhesion - Peel Strength  3 pounds/inch
            Lapshear      <100 psi
Hardness (A) - 75
Volume Resistance 0.01
Pot Life - 2 hours
  with reaction inhibitor - 3 hours Salt Fog Exposure (ASTM-B-117)

| Example | Initial Resistance (ohms/square) | 250 Hrs | 500 Hrs | 1000 Hrs |
| --- | --- | --- | --- | --- |
| 2 (cured at 2 hrs/ 140° F.) | .035 (ohms/sq) | .10 | .10 | .5 |
| 2A (cured at 30 min/ 250° F.) | .055 (ohms/sq) | .055 | .80 | .20 |

Shielding Effectiveness

Figure 2:
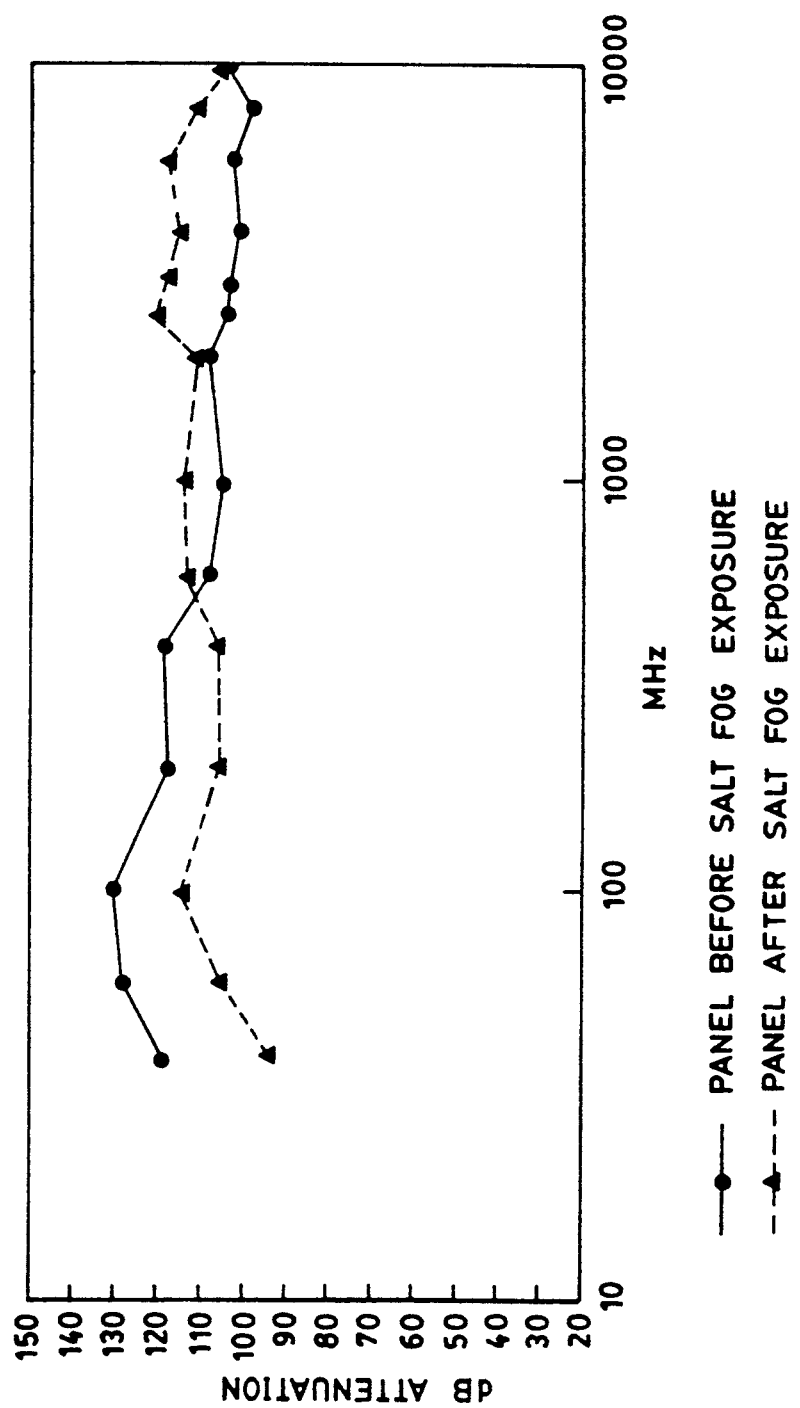
FIG. 2 shows the shielding effectiveness of the material of Example 2.

The same test fixture and test, as described in Example 1, was run with a sample of Example 2. The shielding effectiveness is shown in FIG. 2. Line A represents the shielding effectiveness of the material before exposure to a SO₂ salt fog. Line B represents the shielding effectiveness after 192 hours of salt fog exposure. As can be seen, the material retains most of its shielding effectiveness and at the high of frequencies exhibited better efficiency after salt fog exposures.

While the present invention has been described with reference to its preferred embodiments, other embodiments, variations and modifications can achieve the same result. Variations, modifications and equivalents of the present invention will be obvious to those skilled in the art and it is intended to cover in the appended claims all such modifications and equivalents as fall within the true spirit and scope of this invention.

I claim:

1. A corrosion inhibiting conductive composition comprising
   (a) a polyurethane resin comprising
      (i) a first polymer selected from the group consisting of polyisocyanurates; and
      (ii) a second polymer selrcted from the group consisting of polymers having an amine functionality, polymers having a hydroxyl functionality, polymers having both amine and hydroxyl functionalities, and mixtures thereof;
   (b) a stabilized conductive filler; and
   (c) an azole.

2. The composition of claim 1 wherein the second polymer is fluorinated.

3. The composition of claim 1 wherein the second polymer is selected from the group consisting of polyether polyols and polyether amines.

4. The composition of claim 1 wherein the second polymer is a fluoroolefin vinyl ether copolymer.

5. The composition of claim 1 wherein the stabilized conductive filler is selected from the group consisting of stabilized copper powder, nickel powder, silver plated metals, nickel-graphite fibers and mixtures thereof.

6. The composition of claim 5 wherein the stabilized copper powder is produced by a process which comprises coating copper powder with silver metal using a silver complex salt solution comprising from 3 to 30 weight percent silver nitrate, from 15 to 70 weight percent ammonium bicarbonate, and from 23 to 75 weight percent trisodium ethylenediaminetetraacetic acid.

7. The composition of claim 1 wherein the stabilized conductive filler is produced by treating an unstabilized conductive filler with a fatty acid.

8. The composition of claim 1 wherein the stabilized conductive filler is produced by treating an unstabilized conductive filler with a noble metal.

9. The composition of claim 1 wherein the azole is selected from the group consisting of aromatic triazoles, imidazoles, and thiazoles.

10. The composition of claim 9 wherein the aromatic triazole is selected from the group consisting of tolytriazole and benzotriazole.

11. The composition of claim 1 further comprising a chromate salt.

12. The composition of claim 11 wherein the chromate salt is zinc based.

13. A corrosion inhibiting conductive composition comprising
   (a) from about 10 to 50 weight percent of a polyurethane resin comprising
      (i) a first polymer selected from the group consisting of polyisocyanurates; and
      (ii) a second polymer selected from the group consisting of amines, polythiols and polyether polyols;
   b) from about 30 to 80 weight percent of a stabilized conductive filler; and
   c) from about 0.1 to 3 weight percent of an azole selected from the group consisting of aromatic triazoles, imidazoles or thiazoles.

14. The composition of claim 13 wherein the polyurethane resin is from about 10 to 25 weight percent of the composition.

15. The composition of claim 13 wherein the first and second polymers are present in a weight ratio of from about 1:2 to 1:6.

16. The composition of claim 13 wherein the stabilized conductive filler is from about 40 to 70 weight percent of the composition.

17. The composition of claim 13 wherein the aromatic triazole is from about 0.5 to 1.75 weight percent of the composition.

18. The composition of claim 13 wherein the second polymer is fluorinated.

19. The composition of claim 13 wherein the second polymer is a fluoroolefin vinyl ether copolymer.

20. The composition of claim 13 wherein the stabilized conductive filler is selected from the group consisting of stabilized copper powder, nickel powder, silver plated metals, nickel-graphite fibers and mixtures thereof.

21. The composition of claim 20 wherein the stabilized copper powder is produced by a process which comprises coating copper powder with silver metal using a silver complex salt solution comprising from 3 to 30 weight percent silver nitrate, from 15 to 70 weight percent ammonium bicarbonate, and from 23 to 75 weight percent trisodium ethylenediaminetetraacetic acid.

22. The composition of claim 13 wherein the stabilized conductive filler is produced by treating an unstabilized conductive filler with a fatty acid.

23. The composition of claim 13 wherein the stabilized conductive filler is produced by treating an unstabilized conductive filler with a noble metal.

24. The composition of claim 13 wherein the aromatic triazole is tolytriazole.

25. The composition of claim 13 wherein the aromatic triazole is benzotriazole.

* * * * *